United States Patent
Perner

(10) Patent No.: US 6,504,779 B2
(45) Date of Patent: Jan. 7, 2003

(54) RESISTIVE CROSS POINT MEMORY WITH ON-CHIP SENSE AMPLIFIER CALIBRATION METHOD AND APPARATUS

(75) Inventor: Frederick A. Perner, Palo Alto, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/855,118

(22) Filed: May 14, 2001

(65) Prior Publication Data

US 2002/0167838 A1 Nov. 14, 2002

(51) Int. Cl.[7] .................................................. G11C 7/02
(52) U.S. Cl. ........................ 365/209; 365/129; 365/158
(58) Field of Search .............................. 365/173, 158, 365/129, 209, 189.01

(56) References Cited

U.S. PATENT DOCUMENTS 6,259,644 B1 * 7/2001 Tran et al. .................. 365/158
6,262,625 B1 * 7/2001 Perner et al. .................. 330/2

* cited by examiner

Primary Examiner—Hoai Ho

(57) ABSTRACT

A resistive cross point memory (RXPtM) cell array device, one example of which is a magnetic random access memory (MRAM) device, includes a chip on which is formed an array of RXPtM cells, an array of sense amplifiers used in sensing resistance values of the RXPtM cells, and an input/output (I/O) controller. The I/O controller includes a calibration controller, which tests the combination of a particularly selected memory cell and a particular associated one of the array of sense amplifiers in view of then existing environmental conditions, to assure that the sense amplifier has an acceptable calibration. Data integrity of the RXPtM cell array device is assured by a method in which each operation to sense data from the device includes a calibration test, which if not passed results in the sense amplifiers being recalibrated. When proper calibration of the sense amplifies is indicated, then sensing of the data value proceeds.

22 Claims, 5 Drawing Sheets

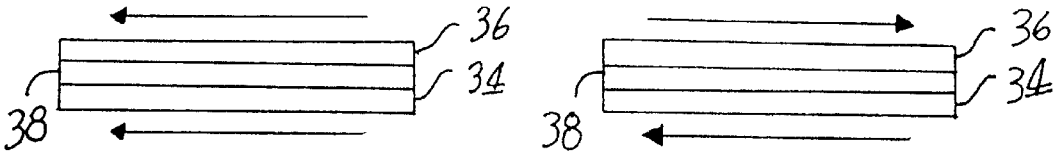
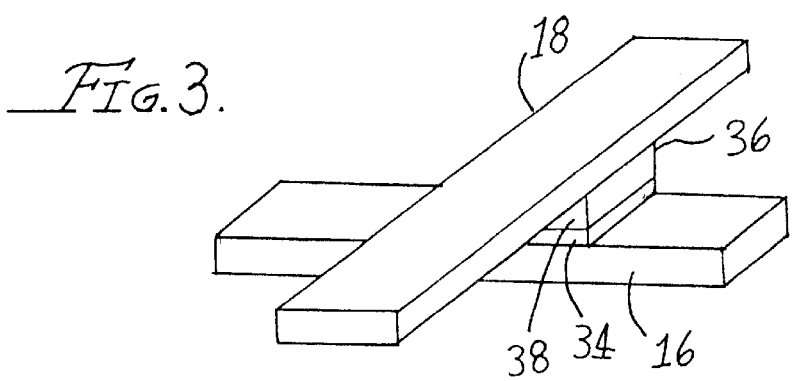
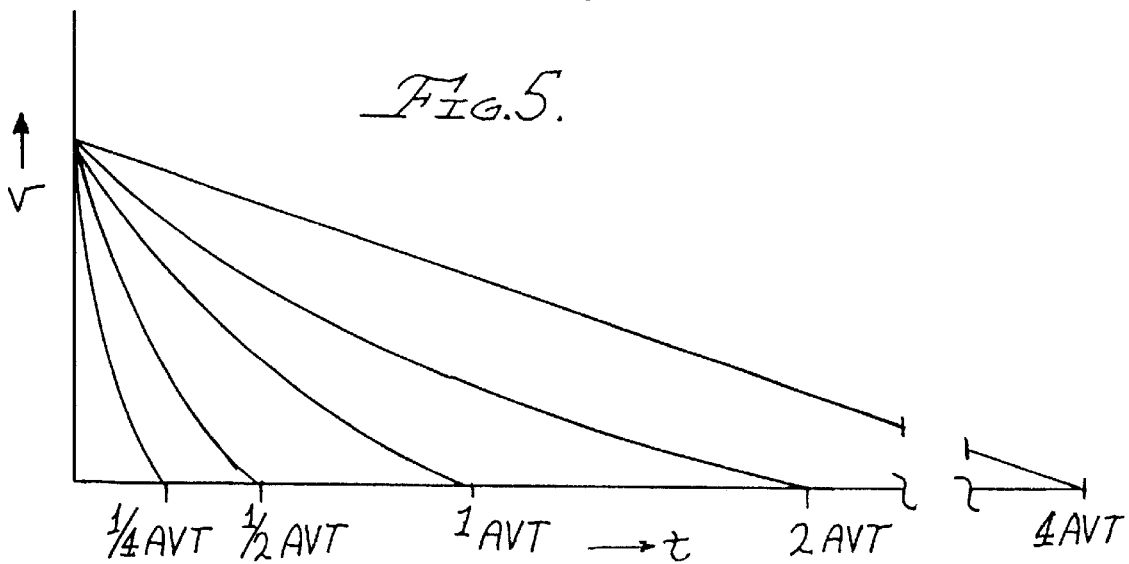

RESISTIVE CROSS POINT MEMORY WITH ON-CHIP SENSE AMPLIFIER CALIBRATION METHOD AND APPARATUS

BACKGROUND OF THE INVENTION

1. Field of the Invention

The present invention relates to devices for data storage and retrieval. Particularly, this invention relates to a resistive cross point memory (RXPtM) cell array, one example of which is a magnetic random access memory (MRAM), and to circuitry for sensing a resistive state of a memory cell in the array so as to sense a stored data value from the memory cell. It is conceivable that other forms of RXPtM's will be developed that are not based on MRAM use, and the methods described in this invention disclosure will apply to those also. More particularly, this invention relates to a method and apparatus for testing for acceptable calibration of a sense amplifier which is utilized in sensing the resistance value of a memory cell and sensing a stored data value from a memory cell, and for initiating recalibration of the sense amplifier, when needed, all without destroying data stored in the memory cell.

2. Related Technology

Magnetic Random Access Memory ("MRAM") is a non-volatile memory that is being considered for long term data storage. A typical MRAM device includes an array of memory cells. Word lines extend along rows of the memory cells, and bit lines extend along columns of the memory cells. The memory cells are each located at a cross point of a word line and a bit line, and each memory cell includes two masses of magnetic material. One of the masses is magnetically fixed and the other is magnetically variable. A memory cell stores a bit of information as the orientation of relative magnetization of the fixed and variable materials. In other words, the magnetization of each memory cell at any given time assumes one of two stable orientations. These two stable orientations, referred to as "parallel" and "anti-parallel" magnetic orientation, represent logic values of '0' and '1,' for example. The resistance of a memory cell varies dependent upon whether it stores a "0" or a "1" value. That is, the resistance of a memory cell is a first value "R" if the orientation of the magnetization of the fixed magnetic material and of the variable magnetic material is parallel, and the resistance of the memory cell is increased to a second value R+ΔR if the orientation of the magnetization is anti-parallel. The orientation of the relative magnetization of a selected memory cell (and, therefore, the logic state of the memory cell) may be sensed by sensing the resistance value of the selected memory cell.

Performing sense and write operations in MRAM devices could be orders of magnitude faster than performing sense and write operations in conventional long term storage devices, such as hard drives, for example. In addition, the MRAM devices could be more compact and could consume less power than hard drives and other such conventional long term data storage devices.

However, sensing the resistance state of a single memory cell in an array (and thereby "sensing" the data value) can be unreliable. All memory cells in the array are coupled together through many parallel paths (i.e., the bit and word lines). The resistance seen at one cross point equals the resistance of the memory cell at that cross point in parallel with resistances of memory cells in the other rows and columns (again, the array of memory cells may be characterized as a cross point resistor network).

There is a need to reliably sense the resistance states of memory cells in MRAM devices.

Currently, it is known to use a sense amplifier to sense a resistance value associated with a selected memory cell of an array. However, determining when the sense amplifier has an acceptable calibration or needs to be recalibrated is conventionally performed off of the chip on which the array of memory cells is fabricated. Further, conventional methods of determining when a new sense amplifier recalibration is required and performing that recalibration, destroys data in a memory cell. In essence, calibration of such an sense amplifier is a laboratory procedure.

Further, calibration of a sense amplifier so that it can reliably perform this sense operation compensates at the same time for two aspects of the RXPtM array. These two aspects may be considered as "global" and "environmental." That is, the sense amplifier is compensated or calibrated for global factors of the memory cell array that are constant over time. These global factors include such influences as process and geometry variations (i.e., asymmetries in the circuit design and fabrication non-uniformity resulting in threshold voltage variations and resistance and capacitance variations, for example) that occur during fabrication of the memory cell array. At the same time, the environmental factors then existing for the RXPtM array are compensated for. However, compensation for the global factors which are constant over time does not address needed compensations for environmental parameters which change over time. These environmental parameters include such factors as operating temperature of the RXPtM array, and power supply voltage variations.

Thus, there is a need to provide a method and apparatus to determine when recalibration of sense amplifier offset (i.e., calibration) values is necessary for reliably sensing stored data values in a RXPtM.

Further, there is a need for providing of such a method and apparatus to determine when recalibration of a sense amplifier is needed before data is lost because of an amplifier "out of calibration" condition.

Also, there is a need for such a sense amplifier recalibration to be performed without loss of data stored in a RXPtM array.

Still further, there is a need to have such a method and apparatus implemented on the same chip as the RXPtM cell array.

SUMMARY OF THE INVENTION

These needs are met by the present invention. According to one aspect of the present invention, a sense amplifier is employed to sense the resistance state of a set of RXPtM cells, and a digital value of "0" or "1" for each memory element of the set is determined by comparing individual cell sense data to an average data value using a multiple sense method. The sense method uses a "time value." By "time value" is meant that the resistance value of an individual RXPtM cell is determined by a current-to-time conversion when an operating voltage is applied to the RXPtM cell with a sense amplifier.

The "average time value" (ATV) for the set of RXPtM cells is determined, and a pair of test limit values (respectively referred to as "shorts" and "opens" values are set at preferred time values of ¼ATV, and 4ATV, for example. It will be understood that other values of the "shorts" and "opens" test limit values may be utilized. However, and importantly, any memory cell of the set which has an individual time value less than or equal to the "shorts"

value, or greater than or equal to the "opens" value is labeled as inoperative, and is not utilized in determining when a recalibration of the sense amplifier is necessary. That is, a shorted memory cell or an open-circuit memory cell is not included in the set of memory cells which is utilized to determine the need for recalibration of the sense amplifiers.

Further, an additional pair of recalibration high/ recalibration low (Recal Hi/Lo) limit values are determined. These Recal Hi/Lo values may preferably be determined as ½ATV and 2ATV, for example. Again, it is to be understood that other values for the Recal Hi/Lo values might be selected. However, the pair of Recal Hi/Lo values lie between the "shorts" and "opens" values, as will be understood from the explanation above.

Then, for each memory cell of the array in which data is stored, and contemporaneously with an initial "sense" operation of that memory cell, a sense amplifier is employed to sense the resistance value of the memory cell. If a "shorts" or "opens" condition is detected, then the recalibration test result is ignored. That is, a shorted or open-circuited memory cell will not trigger a recalibration. However, if a "shorts" or "opens" condition is not detected, then the results of the testing of the memory cell's resistance is compared to the Recal Hi/Lo limits. So long as the cell's resistance is indicated to be within (i.e., between) the pair of Recal Hi/Lo limits, than sensing of the memory cell proceeds, and no recalibration of the sense amplifier for that memory cell is initiated. On the other hand, if the Recal Hi/Lo limits are exceeded (i.e., meaning that the sensed cell's "time value" is either below ½ATV, or above 2ATV, but not less than ¼ATV or more than 4ATV) then sensing of the memory cell stops, data stored in the memory cell is preserved undisturbed, a sense amplifier recalibration is initiated, and the data stored in the memory cell is sensed later after completion of this sense amplifier recalibration.

Further to the above, the calibration controller is part of an Input/Output controller fabricated on the same chip along with the array of memory cells. Thus, each time a sense operation is to be performed to determine the stored value of a memory cell of the array, an on-chip amplifier test, and recalibration if necessary, takes place before the data value is sensed from the memory cell. Because the on-chip test and recalibration of the sense amplifier used to sense the resistance value (i.e., sense the data value) of a cell takes place on-chip close to the array, the time and power used to carry out this sense process is minimized. Further, the integrity of data stored in the cells of the array is maintained. This is true because data is not sensed until it is confirmed that the sense amplifier that will be sensing the resistance value of the memory cell containing the data has a proper calibration, and that a correct result will be had from the sensing operation performed on the memory cell.

Other aspects and advantages of the present invention will become apparent from the following detailed description, taken in conjunction with the accompanying drawings, illustrating by way of example the principles of the present invention.

BRIEF DESCRIPTION OF THE DRAWING FIGURES

FIGS. 2a and 2b are illustrations of parallel and antiparallel magnetization orientations of a typical MRAM memory cell;

FIG. 3 is an illustration of an MRAM memory cell that has been selected during a sensing step;

FIG. 5 is a graphical illustration of time values used in testing a memory cell and associated amplifier fro proper calibration under then existing environmental conditions;

DETAILED DESCRIPTION OF AN EXEMPLARY PREFERRED EMBODIMENT OF THE INVENTION

The present invention is most preferably embodied in an MRAM memory device, which includes a memory cell array, a sense amplifier array, and an input/output (I/O) controller, all on a single chip. That is, the elements of the memory cell array, of the sense amplifier array, and of the I/O controller are all formed on the same chip. Further, the I/O controller includes an amplifier calibration controller, which is responsible for carrying out the amplifier recalibration evaluation process with respect to each memory cell of the array before data is sensed from that particular cell. Thus, data stored in cells of the array is never compromised or destroyed by an attempt to sense the data with a sense amplifier that is out of calibration with respect to global or environmental conditions of the RXPtM array. Environmental conditions of the RXPtM array, which change with time, are compensated for by recalibration of the sense amplifier before they can have a detrimental effect on the reliability of data retrieval from the cells of the array.

Figure 1:
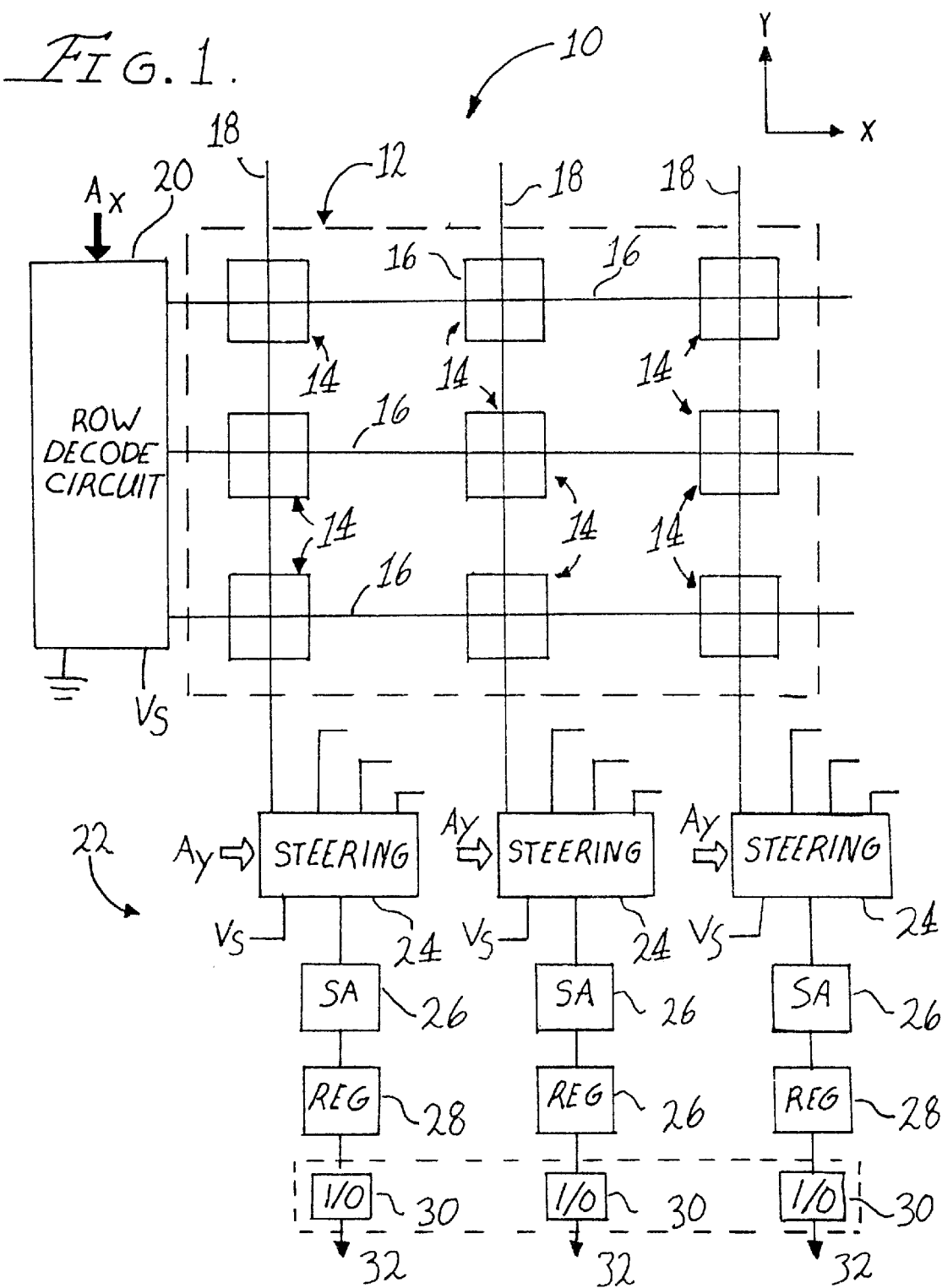
FIG. 1 is a very generalized schematic illustration of an MRAM memory cell array according to the present invention.

Reference is now made to FIG. 1, which schematically illustrates an MRAM device 10 including an array 12 of memory cells 14. The memory cells 14 are arranged in rows and columns of the array, with the rows extending along an x-direction and the columns extending along a y-direction. Only a relatively small number of memory cells 12 are shown in FIG. 1 in order to simplify the description of the invention. In practice, arrays of any size may be used.

Conductive traces functioning as word lines 16 extend along the x-direction in a plane of the memory cell array 10. Other conductive traces functioning as bit lines 18 extend along the y-direction in a plane of the memory cell array 10. There may be one word line 16 for each row of the array 10 and one bit line 18 for each column of the array 10. Each memory cell 14 is located at a cross point of a corresponding word line 16 and bit line 18, hence the name "resistive cross point memory" cell array, or RXPtM.

The memory cells 14 are not limited to any particular type of device. For example the memory cells 14 may be fabricated to utilize spin dependent tunneling ("SDT") junction devices. However, the resistance value of each of the memory cells 14 is dependent upon the value (i.e., 1 or 0) of a data bit stored in the particular cell.

Further considering FIG. 1, the RXPtM cell array 10 also includes a row decode circuit 20. During sense operations, the row decode circuit 20 may apply either a constant supply voltage Vs or a ground potential to selected ones of the word lines 16. The constant supply voltage Vs may be provided by an external circuit.

The RXPtM cell array 10 further includes a sense amplifier circuit for sensing the resistance of selected memory cells 14 during sense operations, and a write circuit for orienting the magnetization of selected memory cells 14 during write operations. The sense amplifier circuit is indicated generally at 22. The write circuit is not shown in order to simplify the explanation of the present invention.

The sense amplifier circuit 22 includes a plurality of steering circuits 24 and sense amplifiers 26. Also, this circuit 22 preferably includes an analog to digital converter, including an integrator, a comparator, and a pre-settable counter (which sub-components are not individually indicated on drawing FIG. 1). Multiple bit lines 18 are connected to each steering circuit 24. Each steering circuit 24 includes a set of switches that connect each bit line 18 to either a source of operating potential or to a sense amplifier 26. An output of the sense amplifier 26 is supplied to a data register 28, which, in turn, is coupled via an I/O controller circuit 30 to an output (indicated by arrowed numeral 32) of the MRAM device 10. The I/O controller 30 controls the entire MRAM device 10 (hence, the dashed box encompassing sub-parts of I/O controller 30 in FIG. 1, to be further described below), and the outputs 32 may be common to one another (i.e., via a shared data I/O port, for example).

Referring now to FIGS. 2a and 2b, a typical SDT junction memory cell 14 includes a magnetic layer 34 of "pinned" or fixed magnetic orientation. The layer 34 has a magnetization that is oriented in the plane of the pinned layer 34, and which is fixed in a selected direction in this plane so as not to change orientation in the presence of an applied magnetic field having a magnitude within a range of interest. The SDT junction device 14 also includes a "free" layer 36 having an orientation of magnetization that is not pinned. Rather, the magnetization of the layer 36 can be selectively oriented in either of two directions both lying in the plane of the layer 36. If the magnetization of the free and pinned layers 34 and 36 are generally in the same direction, the orientation is said to be "parallel" (again, as is indicated by the arrows in FIG. 2a). If the magnetization of the free and pinned 34 and 36 layers are generally in opposite directions (viewing FIG. 2b), then the orientation is said to be "anti-parallel." The magnetization in the free layer 36 may be selectively oriented by applying write currents to word and bit lines 16 and 18 that cross the memory cell 14.

The free and pinned layers 34 and 36 are separated by an insulating tunnel barrier 38. The insulating tunnel barrier 38 allows quantum mechanical tunneling to occur between the free and pinned layers 34 and 36. This tunneling phenomenon is electron spin dependent, making the resistance of the SDT junction device 14 a function of the relative orientations of the magnetization of the free and pinned layers 34 and 36. Again, the resistance of a SDT junction device 14 will have a first value R if the orientation of magnetization of the free and pinned layers 34 and 36 is parallel, and will have a second value R+ΔR if the magnetization of orientation is anti-parallel.

Referring to FIG. 3 a selected memory cell 14 is illustrated during a sense operation. During the write operation which stored a data value in the memory cell 14, the magnetization in the free layer 36 of the selected memory cell 14 was oriented by applying the currents to both the word line 16 and bit line 18 crossing that memory cell 14. Applying the currents to the word line 16 and bit line 18 caused the magnetization of the free layer 36 to rotate to a selected one of the parallel orientation or to the anti-parallel orientation. Thus, a resistance value (i.e., R, or R+ΔR) between the lines 16 and 18 for cell 14 is associated with the stored data value.

Figure 4:
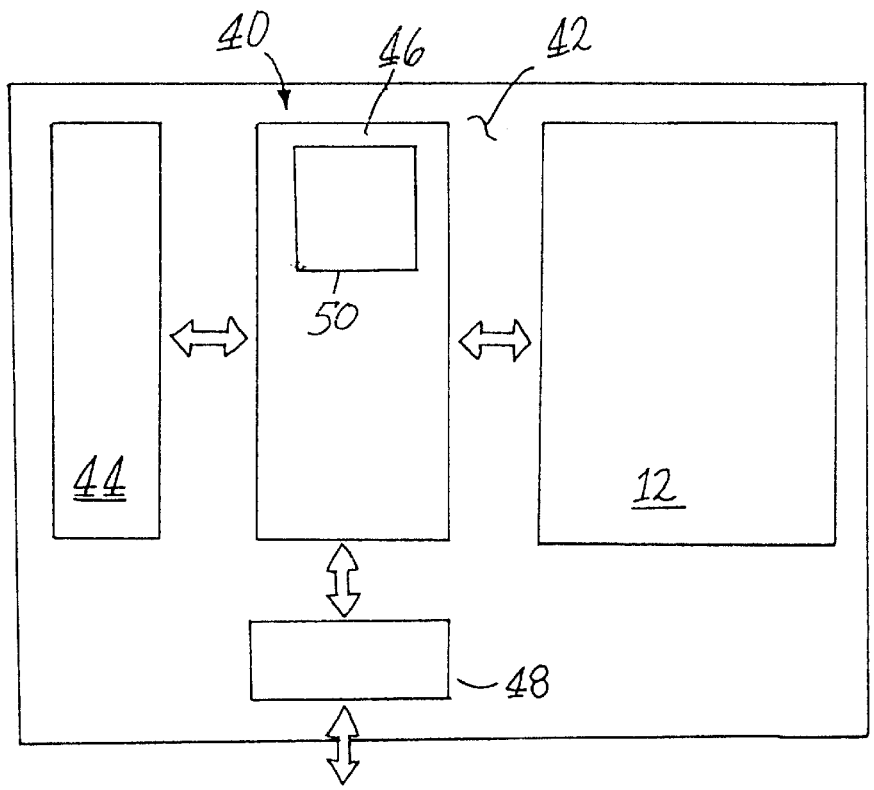
FIG. 4 is a more particularized illustration of a memory chip including a memory cell array, an amplifier array, and an I/O controller, all on a single chip.

FIG. 4 illustrates a MRAM memory chip 40 embodying the present invention. Viewing FIG. 4 it is seen that the MRAM chip includes a substrate 42 upon which the MRAM device 10 including the array 12 of cells is formed. Also formed on this same substrate 42 is a sense amplifier array 44, which includes a plurality of sense amplifiers 26, recalling the description of FIG. 1 above. Controlling the interface of the array 44 of amplifiers 26, and the array of memory cells 12 is a global controller circuit 46. The global controller circuit 46 includes row circuits 20 and column circuits 22, and also moderates communication of data into and from the array 12 via an input/output port 48 (i.e., indicated with the double-headed arrow on FIG. 4). While the global controller circuit 46 will include circuit portions in addition to those described here, it is important to note that this global controller circuit 46 includes a calibration controller 50.

Calibration controller 50 is effective upon each command from global control circuit 46 to sense a data bit (i.e., to sense a relevant resistance value) from a memory cell of the memory cell array 12, to test the calibration of the one of the sense amplifiers of the amplifier array 44 which will effect this sensing of the selected memory cell.

Figure 7:
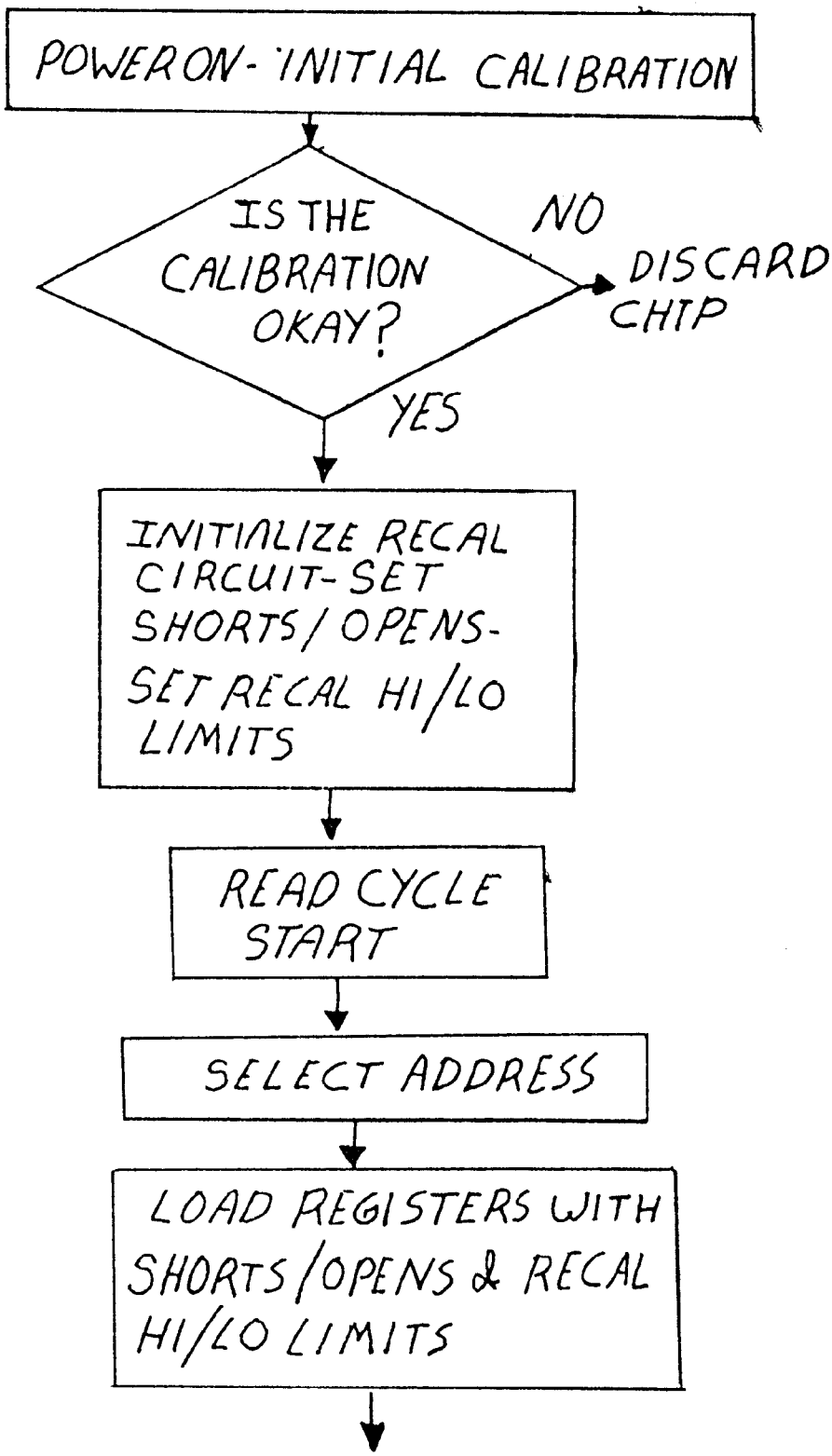
FIG. 7 is a method flow chart illustrating a method of sensing a memory cell of a MRAM memory cell array, while contemporaneously testing for proper amplifier calibration.
Figure 7:
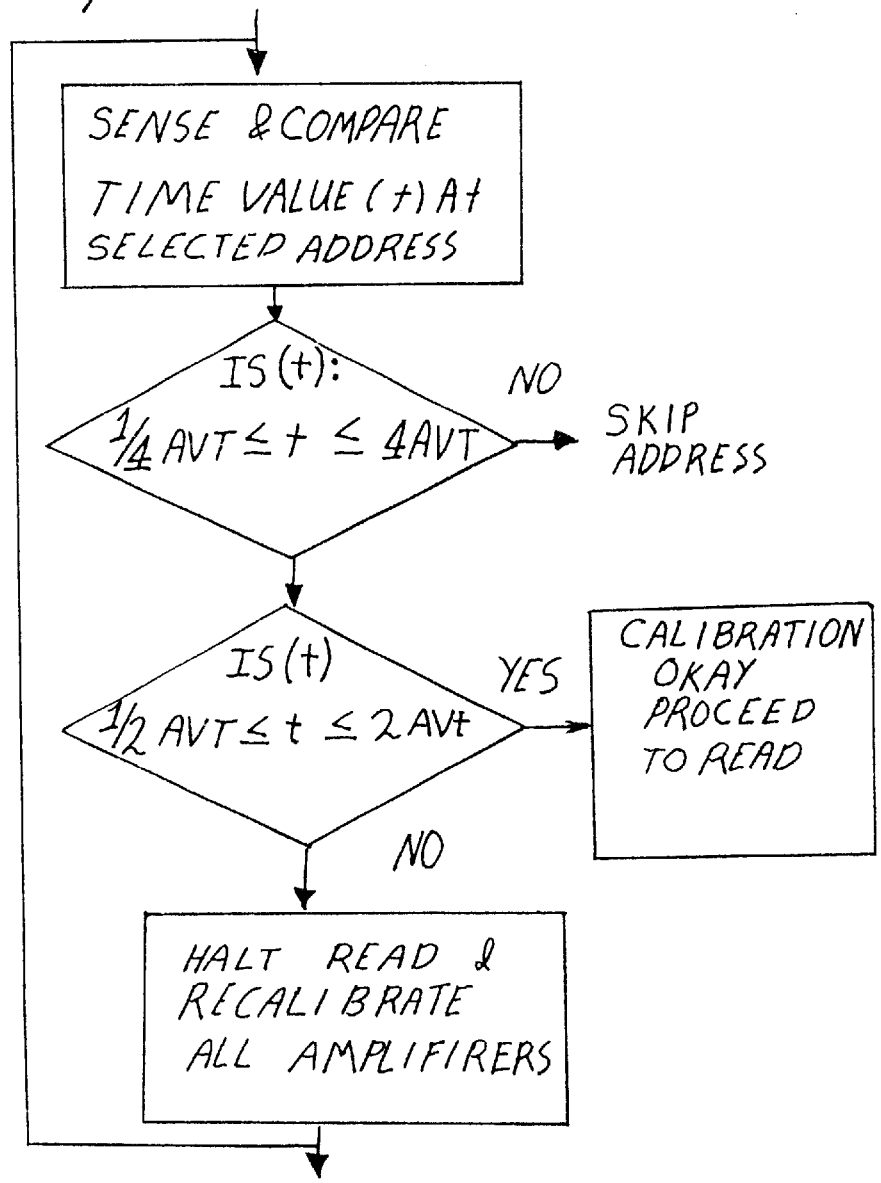

Importantly, FIG. 5 depicts a time versus voltage relationship that is preferably utilized according to the present invention in order to make a determination as to whether a particular sense amplifier has a correct calibration, and if not, to initiate a calibration of the particular sense amplifier. Considering now FIGS. 5 and 7 in conjunction with one another, it is seen in FIG. 5 that a particular time value is indicated as having a value of "1" and is labeled 1AVT (average time value). The time interval indicated as 1ATV is determined by individually testing (i.e., connecting) memory cells of a selected set of representative memory cells (i.e., representative of the cells of memory cell array 12) with an integrator circuit with the selected memory cell, and a pre-charged integration capacitor, an integrator, a comparator, and a pre-settable counter. The result is that the integration capacitor is discharged over time via the integrator, and the curve of voltage difference between Vdd and the charge level on the capacitance (i.e., in volts) is represented graphically. The time interval for each of the set of memory cells is determined, and the average value of time versus voltage is indicated graphically on the graph of FIG. 5. The average value of time versus voltage is indicated on the graph of FIG. 5 as 1AVT.

Next, values of ¼AVT, of ½AVT, of 2AVT, and of 4AVT are determined. An outer pair of the time values indicated on FIG. 5 (i.e., the values of time indicated as ¼AVT and as 4AVT) are identified as values of time indicative of "shorts" and "opens," respectively. That is, if a particular memory cell is selected, and if the time interval measured is less that ¼AVT then the memory cell is considered to be shorted and to be bad. On the other hand, if the time interval measured is greater than 4AVT, then the memory cell is considered to be open-circuited, and is also bad. Bad memory cells are not used in testing for proper calibration of the sense amplifiers of the amplifier array 44.

Again, it will be understood that other values of the "shorts" and "opens" test limit values may be utilized. However, the selected and preferred values are powers of 2, and are easily implemented digitally. Further, these selected values for the test limits have been shown by actual testing of the invention to provide very reliable operation for the MRAM chip 40.

Further, an additional pair of time intervals (i.e., ½AVT and 2AVT) are designated, and are indicated as recalibration high/recalibration low (Recal Hi/Lo) limit values. These Recal Hi/Lo values are the values within (i.e., between) which the time interval for a particular selected memory cell which is to be sensed must fall in order to indicate that the sense amplifier which will sense this memory cell has a proper calibration in view of the environmental factors then effective on the memory cell array 12. That is, the operating voltage Vdd of the MRAM chip 40 may have drifted, or the temperature of the memory cell array 12 may have changed so that the resistance of the memory cells and other circuit elements of the chip 40 is changed. The result is that if the time interval for the particular memory cell falls within the range from ½AVT to 2AVT, then the memory cell will be sensed, it is anticipated that the sensing result may be relied upon, and a recalibration of the sense amplifiers of array 44 will not be initiated. On the other hand, if the time interval for the selected memory cell does not fall in the range from ½AVT to 2AVT, but instead falls into one of the two "recalibrate" time interval ranges from ¼AVT to ½AVT, or from 2AVT to 4AVT, then the sense amplifiers for array 44 are recalibrated.

That is, if a "shorts" or "opens" condition is detected, then the recalibration test result is ignored. A shorted or open-circuited memory cell will not trigger a recalibration of the sense amplifiers of array 44. Similarly, a shorted or opened memory cell will not have been used by the controller circuit 46 to store a data bit. However, if a "shorts" or "opens" condition is not detected, then the results of the testing of the memory cell's resistance is compared to the Recal Hi/Lo limits. So long as the cell's resistance is indicated to be within (i.e., between) the pair of Recal Hi/Lo limits, than sensing of the memory cell proceeds, and no recalibration of the sense amplifier for that memory cell is initiated. On the other hand, if the Recal Hi/Lo limits are exceeded (i.e., meaning that the sensed cell's "time value" is either below ½ATV, or above 2ATV, but not less than ¼ATV or more than 4ATV) then sensing of the memory cell stops, data stored in the memory cell is preserved undisturbed, a sense amplifier recalibration is initiated, and the data stored in the memory cell is sensed later after completion of this sense amplifier recalibration.

Figure 6:
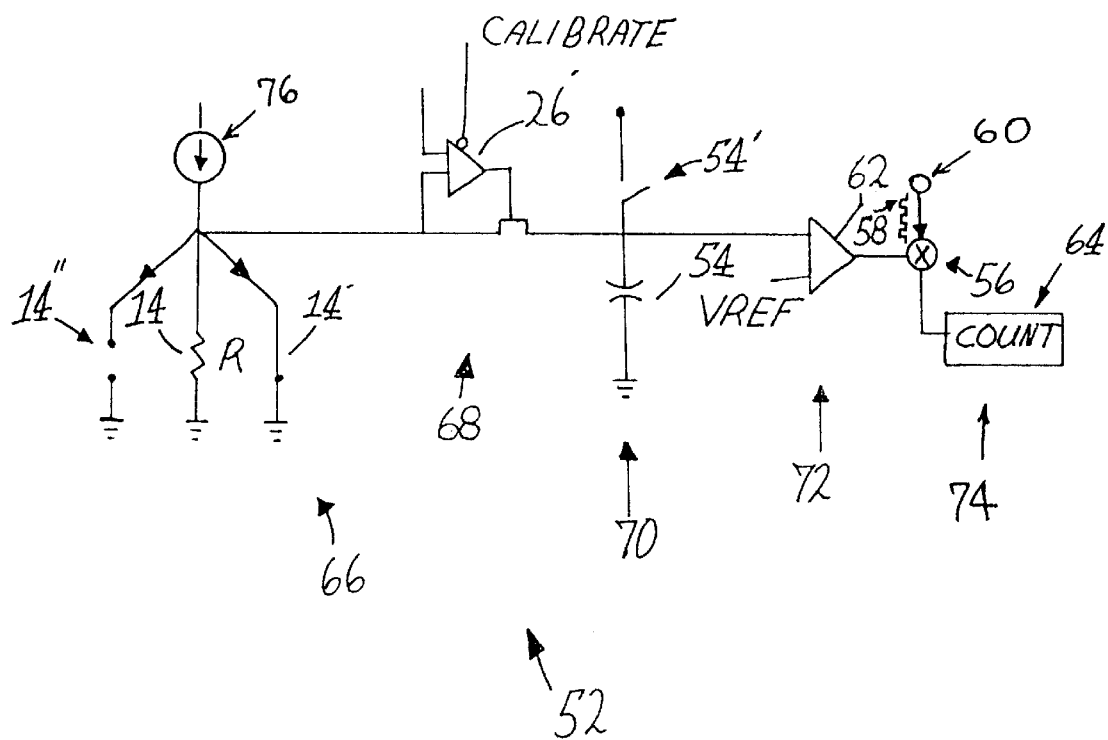
FIG. 6 illustrates a generalized schematic of a circuit that may be utilized in the methods of sensing a memory cell in a resistive cross point memory cell array.

Considering now FIG. 6, a preferred implementation of a circuit portion 52 of the calibration controller 50 is illustrated. This circuit portion 52 may be termed an individual sense amplifier portion, and it is switched into connection with a particular memory cell at the same time as the sense amplifier 26 which will be then used to sense that memory cell and as that sense amplifier is then calibrated (i.e., provided that the result of the calibration test explained above is to proceed without a calibration). In fact, the circuit portion 52 and sense amplifier 26 may share circuit elements, as will be clear in view of the explanation below. This circuit portion 52 includes a selected RXPtM cell 14, a capacitance 54 with a charging switch 54', a comparator amplifier 26', and a switching junction 56 receiving clock counts 58 from a source 60. The conductivity of junction 56 (i.e., switched either opened or closed) is controlled by a voltage comparator circuit 62. Further, the number of clock pulses which pass through junction 56 while the junction 56 is switched closed is recorded in a counter 64 for data sensing and calibration uses, as will be further explained.

Also included in the illustration of FIG. 6 (which will be recalled to be a schematic circuit diagram) is an indication of the location and effect of a shorted memory cell (i.e., indicated with reference numeral 14'), and of an open memory cell (indicated with a reference numeral 14"). The indications 14' and 14" seen on FIG. 6 are provided merely so that the reader will have an appreciation of the location and effect of either a shorted or open memory cell. It will be understood in view of the above, and the following description, that a shorted or open resistive memory cell will be indicated in accord with the above description of the time values obtained for such shorted and open memory cells. That is, it is to be understood that the count value stored in counter 64 is indicative of a particular time interval as is graphically depicted on FIG. 5, so that the time values ¼AVT, ½AVT, 1AVT, 2AVT, and 4AVT are indicated according to a stored digital value in counter 64. Thus, a simple comparison of the digital value of actual clock counts stored in counter 64 to the counts for these time intervals determines whether a time value for the memory cell 14 under the then existing environmental factors for the MRAM chip 40, and with the existing calibration of sense amplifier 26 is acceptable according to the test explained above. If the time value is acceptable, then the count value in counter 64 is stored for use as an indication (i.e., in view of a further test) of the binary value ("1" or "0") stored in the cell 14 being sensed.

Considering FIG. 6 still, it is seen that the circuit 52 includes a load model 66 for the resistive cross point memory cell. This load model may be considered to be typical (i.e., representative) of the particular resistive cross point memory cell being sensed. Again, this particular resistive cross point memory cell may be shorted, may be open, or may have a normal resistance. However, if the resistive cross memory cell being sensed has a normal resistance, then the sense amplifier 26 may have an acceptable calibration, or may require recalibration before the sensing operation is completed.

The comparator amplifier 26' is a constant voltage pre-amplifier (indicated generally with numeral 68), which effectively isolates the resistance R (i.e., resistance 14) from the integrator circuit 70. The comparator amplifier 26' behaves as a current source while maintaining a constant voltage across the resistance 14 of the resistive cross point memory cell being sensed.

An integrator 70 includes the switch 54', the capacitor 54, and a ground connection (as indicated on the drawing FIG. 6). This integrator allows the load current (i.e., sneak path current plus current through the load resistor R (i.e., resistor 14)) to discharge capacitor 54. The rate of decay of the voltage at the integrator is a direct function of the load current. If the load is shorted (i.e. 14') then the pre-amp current will be very high and the integrator will discharge very quickly. If the load is open (i.e., 14"), then the integrator 70 will discharge at a rate determined by the sneak path currents and by the circuit design. Then the discharge time will be very large. A normally resistive cross point memory cell (i.e., resistance 14) will cause the discharge time to fall within the range explained above.

Comparator section 72 includes the comparator circuit 62, and a connection to a reference voltage source (indicated on FIG. 6). The comparator 62 controls the gate 56 to open (i.e., switch closure) at the beginning of the integration period, and to close (i.e., switch opening) at the time when the voltage from capacitor 54 equals Vref.

The circuit 52 also includes the counter and storage circuit 74, which includes switching junction 56, a connection to a clock pulse source (indicated at 60) and the counter 64. The result of the stored count value at counter 64 is compared to the reference values (i.e., ¼AVT, ½AVT, 1AVT, 2AVT, and 4AVT) as described above, in order to determine if recalibration of the sense amplifier 26 is or is not necessary.

Finally, it is seen that the circuit 52 includes a representation at 76 of a current source, providing a current (which is a parasitic current) also flowing through the resistance of cell 14. The current source 76 is representative of sneak path currents resulting through the other resistive cells of a cell array, and realized at a particular cell 14 under evaluation.

Again, if the count value of counter 64 does not fall within the range of ½AVT to 2AVT (i.e., as explained above, in accord with this preferred embodiment, and remembering that the invention is not so limited), then the sense operation is suspended, and the sense amplifier 26 is recalibrated before sensing of the cell 14 continues (provided that the cell does not give a "short" or "open" value—recalling the additional indications 14' and 14" of FIG. 6).

When the time value for cell 14 falls within the acceptable range from ½AVT to 2AVT (i.e., either before or after recalibration of the sense amplifier 26) then the cell is further sensed by writing either a zero ("0") or one ("1") value to the cell, and sensing its resistance value with the same calibration of sense amplifier 26; then the other of a zero ("0") or one ("1") value is written in the cell 14, and is sensed again with the same calibration of sense amplifier 26.

Each of these sensing steps gives a count value in counter 64, which is sensed and stored. A comparison between the first sensing count and the second sensing count; and between the first sensing count and the third sensing count, will give an unambiguous indication of which value of value (i.e., zero ("0") or one ("1")) was originally stored in the particular memory cell 14. This determined value of zero ("0") or one ("1") is then written back into cell 14 to complete the sense process for the particular memory cell 14. Thus, it is seen that the above sensing process includes triple sensing steps each alternating with triple writing steps. Further, in the event that recalibration of the sense amplifier is necessary, this necessity is determined at the first sensing step before the first writing step, and the sense amplifier is then recalibrated. After this recalibration, the triple sense and triple write operation is carried out.

Those ordinarily skilled in the pertinent arts will appreciate that the identities of data values stored in each memory cell 14 of an array 12 is verified by this method contemporaneously with sensing a resistance value indicative of the stored value. That is, a triple sense and triple write process is carried out, with the first step in the process (i.e., the first sense step) being carried out contemporaneously with a test to determine that the particular memory cell and its associated sense amplifier have a proper calibration in view of then existing environmental factors. If not, then the sensing operation is suspended, and the sense amplifiers are all recalibrated. When the calibration factors are within an acceptable range (i.e., determined by a time factor for a cell to be sensed that falls within the range from ½AVT to 2AVT) then the sensing operations continue. Because this method is carried out each time data is to be sensed from a memory cell, the validity of data sensed out of the array 12 is assured.

Accordingly, those ordinarily skilled in the pertinent arts will understand that the invention is subject to modification and change in accord with the spirit and scope of the description and disclosure above. Although reference is made to a particularly preferred embodiment of the invention, such reference does not imply a limitation on the invention, and no such limitation is to be inferred. Further, the invention is not limited to the specific embodiments described and illustrated above. Instead, the invention is to be construed according to the claims that follow, which provide a definition of the invention.

I claim:

1. A resistive cross point memory (RXPtM) device which is responsive to environmental factors including temperature and operating voltage, said device comprising:

plural RXPtM cells, each of said RXPtM cells including a pair of magnetic layers one of which is fixed in magnetic orientation, and the other of which is variable in magnetic orientation; a resistive layer interposed between said pair of magnetic layers, so that each of said plural RXPtM cells has a characteristic resistance dependent upon the respective magnetic orientation of said other magnetic layer;

a grid of conductors crossing one another at and electrically connecting to respective ones of said pair of magnetic layers of said plural RXPtM cells;

a variable-calibration sense amplifier associated with said plural RXPtM cells to sense the resistance of a selected one of said cells; and a calibration controller associated with both said plurality of RXPtM cells and with said sense amplifier, so as to test the calibration of said sense amplifier for sensing selected RXPtM cell in view of existing environmental factors.

2. The RXPtM cell array of claim 1, further including a single substrate, said single substrate carrying all of:

said RXPtM cell array;

said variable-calibration sense amplifier; and said calibration controller, which calibration controller includes an integrator with a capacitor, a comparator, and a pre-settable counter.

3. The circuit of claim 2, wherein said calibration controller includes circuit means for applying a constant voltage to a selected one of said plurality of RXPtM cells and to said integrator, said comparator receiving a time-variant capacitor discharge voltage signal from said capacitance and outputting a signal indicative of discharging of said capacitor to a selected voltage level, a switching junction switching between a conductive and a nonconductive state dependent upon the value of said outputted comparator signal, a clock generating clock count pulses, and said pre-settable counter receiving clock count pulses from said source via said switching junction while said switching junction is conductive.

4. In a RXPtM cell array device, a method of testing for needed recalibration of a sense amplifier which is utilized to sense a resistance value of a selected RXPtM cell of the array, and in view of present values of time-variant operating parameters of the RXPtM cell array, said method comprising steps of:

defining an average time value, which is indicative of averaged time values for each of a selected set of RXPtM cells, while the resistance of each cell of the selected set of cells is connected in series with a selected pre-charged capacitance, and with present operating parameters of the RXPtM cell array applying;

determining a time value, which is indicative of connection of the resistance of the selected RXPtM cell and said selected pre-charged capacitance in series;

comparing the time value to the average time value to determine a difference value; and recalibrating the sense amplifier if the difference value exceeds a first determined range.

5. The method of claim 4, further comprising the step of ignoring the difference value and not recalibrating the sense amplifier, if the difference value exceeds the first determined range and also exceeds a second determined range.

6. A self-calibrating resistive cross point memory (RXPtM) cell array chip, said RXPtM cell array chip having a substrate upon which is defined an array of plural memory cells, an array of sense amplifiers each associated with a group of the memory cells of the array of plural memory cells, and circuit means for testing validity of data sensing from each of said memory cells via the associated sense amplifier; said chip comprising in combination:

a substrate;

a rectangular array of plural RXPtM cells defined on said substrate, each of said RXPtM cells including a pair of magnetic layers and having a resistance value dependent upon the relative direction of magnetization of said pair of magnetic layers;

a grid of conductive word and bit lines crossing one another at and electrically connecting to respective ones of said plural RXPTM cells of said array, said resistance value of each RXPtM cell of said array being connected between word and bit lines crossing at the respective memory cell;

an array of variable-calibration sense amplifiers formed upon said substrate, and each associated with plural ones of said plural RXPtM cells to sense the resistance of a selected one of said plural RXPtM cells; and a calibration controller formed on said substrate and associated with both said array of RXPtM cells and with said array of sense amplifiers, so as to test an electrical connection of a selected one of the plural memory cells and a particular sense amplifier for acceptable calibration of the amplifier.

7. The memory chip of claim 6, wherein said calibration controller further includes an integrator with a capacitor, a comparator, and a pre-settable counter.

8. The memory chip of claim 7, wherein said calibration controller further includes a switch having connection to a source of controlled charging voltage for said capacitor, and when closed said switch conducting said controlled charging voltage to said capacitor to pre-charge said capacitor.

9. The memory chip of claim 7, wherein said integrator includes said precharged capacitor, and a resistive load selected from among said plural RXPtM cells.

10. The memory chip of claim 7, wherein said comparator includes a connection to s aid pre-charged capacitor, and a connection to a source of reference voltage.

11. The memory chip of claim 7, wherein said pre-settable counter includes a connection to said comparator via a switchable junction opening and closing under control of said comparator, and connection to a source of clock pulses via said switchable junction.

12. A method of operating a resistive cross point memory (RXPtM) cell array device; said device including a plurality of memory cells and an sense amplifier connected to a selected one of said plurality of memory cells to sense a variable resistance value of the selected memory cell, which variable resistance value is indicative of a binary data value stored in the selected memory cell; said sense amplifier having a settable calibration; and apparent resistance of the selected memory cell also varying in response to time-variant environmental factors irrespective of a data value stored in the selected memory cell; said method including steps of:

calibrating the sense amplifier;

utilizing a selected group of the plural memory cells to establish an average resistance value for a memory cell;

storing a data value in the selected memory cell;

in preparation to sensing the stored data value from the selected memory cell, testing apparent resistance of the selected memory cell with presently existing environmental factors, and if the apparent resistance is within a determined range of said average resistance value, then sensing the data value from the selected memory cell using the sense amplifier.

13. The method of claim 12 further including the steps of recalibrating the sense amplifier if the apparent resistance of the selected memory cell is outside of the determined range.

14. The method of claim 12 including the step of ignoring the selected memory cell and not recalibrating the sense amplifier if the apparent resistance of the selected memory cell is outside of the determined range and also outside of a second wider certain range from the average resistance value.

15. The method of claim 12 wherein said sensing step includes:

sensing the apparent resistance of said selected memory cell, and recording the apparent resistance value;

writing either a binary zero or binary one to the selected memory cell, sensing the associated resistance of the memory cell, and recording the associated resistance value;

writing the other of a binary zero or binary one to the selected memory cell, sensing the respective resistance of the memory cell, and recording the respective resistance value;

comparing the apparent resistance value to both of said associated resistance value and to said respective resistance value, and determining the identity of the stored data value according to a minimum difference; and writing the identified data value to the selected memory cell.

16. The method of claim 12 including the step of sensing the apparent resistance value of the selected memory cell after recalibrating the sense amplifier.

17. A resistive magnetic memory cell array device, said memory cell array device being responsive to time-variant environmental factors including temperature and operating voltage to vary an apparent resistance of memory cells of the device, said device comprising in combination:

an array of plural memory cells, each of said memory cells including a spin dependent resistive layer the resistance of which is dependent upon the magnetic fields applied by a pair of adjacent magnetic layers, one of said pair of magnetic layers being fixed in magnetic orientation, and the other of said pair of magnetic layers being variable in magnetic orientation between a parallel and an anti-parallel orientation relative to said fixed layer, each of said memory cells having one of two characteristic resistance values dependent upon the magnetic orientation of said other magnetic layer so as to store binary data values;

a grid of conductive word and bit lines crossing one another at and electrically connecting to respective ones of said plural memory cells of said array;

an array of variable-calibration sense amplifiers each associated with plural ones of said plural memory cells to sense the characteristic resistance of a selected one of said plural memory cells; and a calibration controller associated with both said array of memory cells and with said array of sense amplifiers, so as to test the apparent resistance of a particular memory cell with presently existing environmental factors of temperature and operating voltage applying.

18. A resistive cross point memory (RXPtM) device which is responsive to environmental factors including temperature and operating voltage, said device comprising: plural RXPtM cells, each of said RXPtM cells including a pair of magnetic layers one of which is fixed in magnetic orientation, and the other of which is variable in magnetic orientation; a resistive layer interposed between said pair of magnetic layers; each of said plural RXPtM cells having a characteristic resistance dependent upon the respective magnetic orientation of said other magnetic layer; a grid of row conductors and column conductors crossing one another at and electrically connecting to respective ones of said pair of magnetic layers of said plural RXPtM cells; a variable-calibration sense amplifier associated with said plural RXPtM cells to sense the resistance of a selected one of said cells; and a calibration controller associated with both said plurality of RXPtM cells and with said sense amplifier, so as to test the calibration of said sense amplifier for sensing selected RXPtM cell in view of existing environmental factors; said calibration controller including an integrator, a comparator, and a pre-settable counter.

19. The resistive cross point memory (RXPtM) device of claim 18, wherein said calibration controller further includes a capacitor, and a switch having connection to a source of controlled charging voltage for said capacitor, and when closed said switch conducting said controlled charging voltage to said capacitor to pre-charge said capacitor.

20. The resistive cross point memory (RXPtM) device of claim 18, wherein said integrator includes said pre-charged capacitor, and a resistive load selected from among said plural RXPtM cells.

21. The resistive cross point memory (RXPtM) device of claim 18, wherein said comparator includes a connection to said pre-charged capacitor, and a connection to a source of reference voltage.

22. The resistive cross point memory (RXPtM) device of claim 18, wherein said pre-settable counter includes a connection to said comparator via a switchable junction opening and closing under control of said comparator, and connection to a source of clock pulses via said switchable junction.

* * * * *